US008626106B2

(12) United States Patent
Soe

(10) Patent No.: US 8,626,106 B2
(45) Date of Patent: Jan. 7, 2014

(54) METHOD AND APPARATUS OF AN INPUT RESISTANCE OF A PASSIVE MIXER TO BROADEN THE INPUT MATCHING BANDWIDTH OF A COMMON SOURCE/GATE LNA

(75) Inventor: Zaw Soe, Encinitas, CA (US)

(73) Assignee: Tensorcom, Inc., Carlsbad, CA (US)

( * ) Notice: Subject to any disclaimer, the term of this patent is extended or adjusted under 35 U.S.C. 154(b) by 142 days.

(21) Appl. No.: 13/312,806

(22) Filed: Dec. 6, 2011

(65) Prior Publication Data

US 2013/0143511 A1 Jun. 6, 2013

(51) Int. Cl.
*H04B 1/16* (2006.01)
*H03F 3/19* (2006.01)

(52) U.S. Cl.
USPC ............................ 455/341; 455/334; 330/311

(58) Field of Classification Search
USPC .......................... 455/313, 334, 341; 330/311
See application file for complete search history.

(56) References Cited

U.S. PATENT DOCUMENTS

| 6,366,166 | B1* | 4/2002 | Belot | 330/252 |
|---|---|---|---|---|
| 6,639,468 | B2* | 10/2003 | Belot | 330/252 |
| 6,681,103 | B1* | 1/2004 | Rogers et al. | 455/302 |
| 7,071,779 | B2* | 7/2006 | Shi et al. | 330/253 |
| 7,266,360 | B2 | 9/2007 | Kang et al. | |
| 7,847,635 | B2* | 12/2010 | Aiba | 330/254 |
| 2003/0050296 | A1 | 3/2003 | Bommer et al. | |
| 2003/0210101 | A1 | 11/2003 | McCorquodaie et al. | |
| 2004/0085138 | A1* | 5/2004 | Franca-Neto | 330/311 |
| 2005/0118979 | A1* | 6/2005 | Langenberg et al. | 455/333 |
| 2006/0062277 | A1 | 3/2006 | Friedrich et al. | |
| 2007/0257735 | A1 | 11/2007 | Chan et al. | |
| 2008/0164955 | A1 | 7/2008 | Pfeiffer et al. | |
| 2009/0134947 | A1 | 5/2009 | Tang | |
| 2010/0144290 | A1 | 6/2010 | Khatri et al. | |
| 2010/0255791 | A1* | 10/2010 | Vazny et al. | 455/73 |
| 2010/0259331 | A1* | 10/2010 | Duster et al. | 330/305 |
| 2011/0006850 | A1 | 1/2011 | Shibasaki et al. | |
| 2011/0050296 | A1 | 3/2011 | Fagg | |
| 2012/0201175 | A1* | 8/2012 | Vazny et al. | 370/278 |

FOREIGN PATENT DOCUMENTS

| KR | 1020100085603 | 7/2010 |
|---|---|---|
| WO | 2009111038 | 9/2009 |

OTHER PUBLICATIONS

Behzad Razavi, "A 60-GHz CMOS Receiver Front-End", IEEE Journal of Solid-State Circuits, vol. 41, No. 1, Jan. 2006, vol. 41, No. 1, pp. 17-22.

(Continued)

*Primary Examiner* — Blane J Jackson
(74) *Attorney, Agent, or Firm* — Thaddeus Gabara; Tyrean Patent Prosecution Law Firm

(57) ABSTRACT

A cascode common source and common gate LNAs operating at 60 GHz are introduced and described. The cascode common source LNA is simulated to arrive at an optimum ratio of upper device width to the lower device width. The voltage output of the cascode common source LNA is translated into a current to feed and apply energy to the mixer stage. These input current signals apply the energy associated with the current directly into the switched capacitors in the mixer to minimize the overall power dissipation of the system. The LNA is capacitively coupled to the mixer switches in the I and Q mixers and are enabled and disabled by the clocks generated by the quadrature oscillator. These signals are then amplified by a differential amplifier to generate the sum and difference frequency spectra.

16 Claims, 7 Drawing Sheets

(56) References Cited

OTHER PUBLICATIONS

Aaron V. Do, "A Subthreshold Low-Nose Ampldiar Cptirmzed for Uttra-Low-Power Applications in the ISM Band", IEEE Transactions on Microwave Theory and Techniques, vol. 56, No. 2, Feb. 2008, pp. 286-292.

Page 5-15, J P Silver, "MOS Common-Source LNA Design Tutorial", RF, RFIC & Microwave theory Design, sheet 1-11, http://www.ece.rochester.edu/research/laics/ilfd.html.

Page 16-32, RLC Circuit, Wikipedia, http://en.wikipedia.org/wiki/RLC_circuit.

Page 33-76, UCLA notes, "Introduction to Switched-Capacitor Circuits", Chapter 12, www.ee.ucla.edu/~brweb/teaching/AIC_Ch12.pdf.

Page 77-79, Stephane Pinel, Saikat Sarkar, Pasmanava Sen, Bevin Perumana, David Yeh, Debasis Dawn, Joy Laskar, "A 90nm CMOS 60GHz Radio", Session 6.8, Feb. 4, 2008, IEEE International Solid-State Circuits Conference, San Francisco, CA.

Page 80-81, 47 CFR § 15.257 Operation within the band 57-64 GHz.

Tang-Nian Luo, "A 44 GHz 0.18f.lm CMOS Superharmonic Frequency Divider", Jun. 8, 2007, Microwave Symposium, IEEE/MTT-S International, pp. 1409-1412.

U.S. Appl. No. 13/163,562, KhongMeng Tham.
U.S. Appl. No. 13/243,880, Zaw Soe.
U.S. Appl. No. 13/243,908, Zaw Soe.
U.S. Appl. No. 13/243,986, Zaw Soe.

* cited by examiner

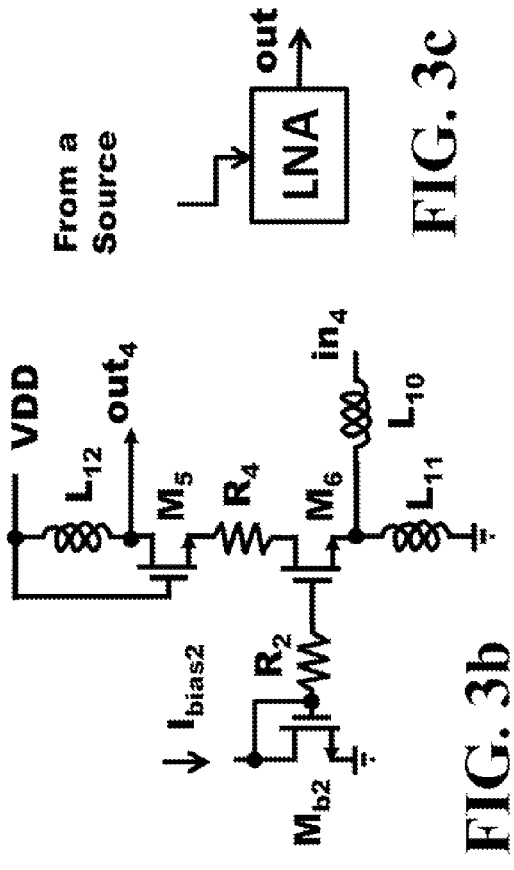
FIG. 3a
FIG. 3b
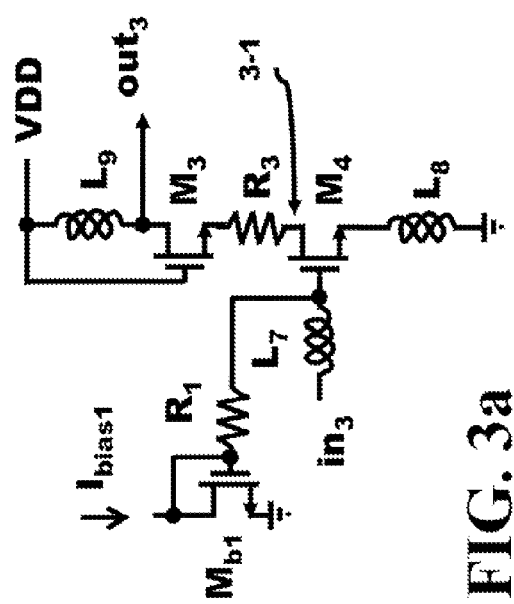
FIG. 3c
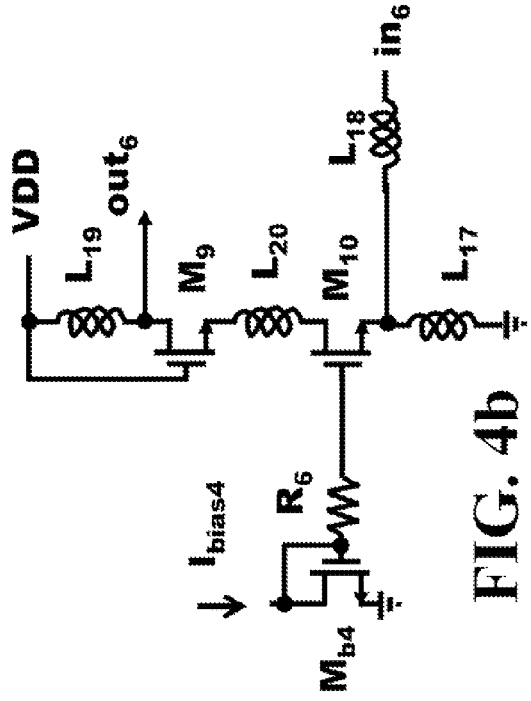
FIG. 4a
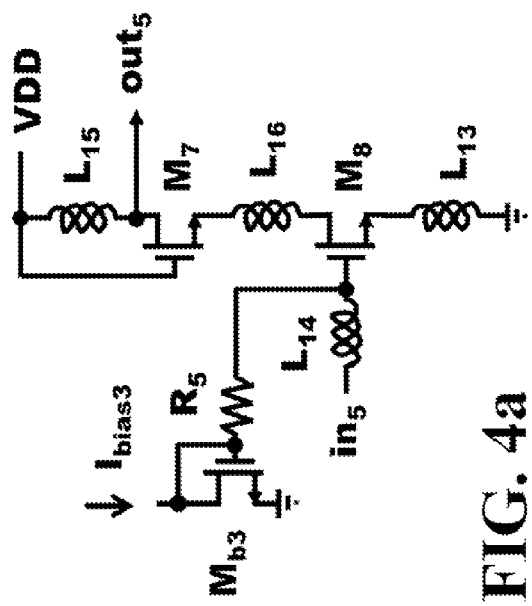
FIG. 4b

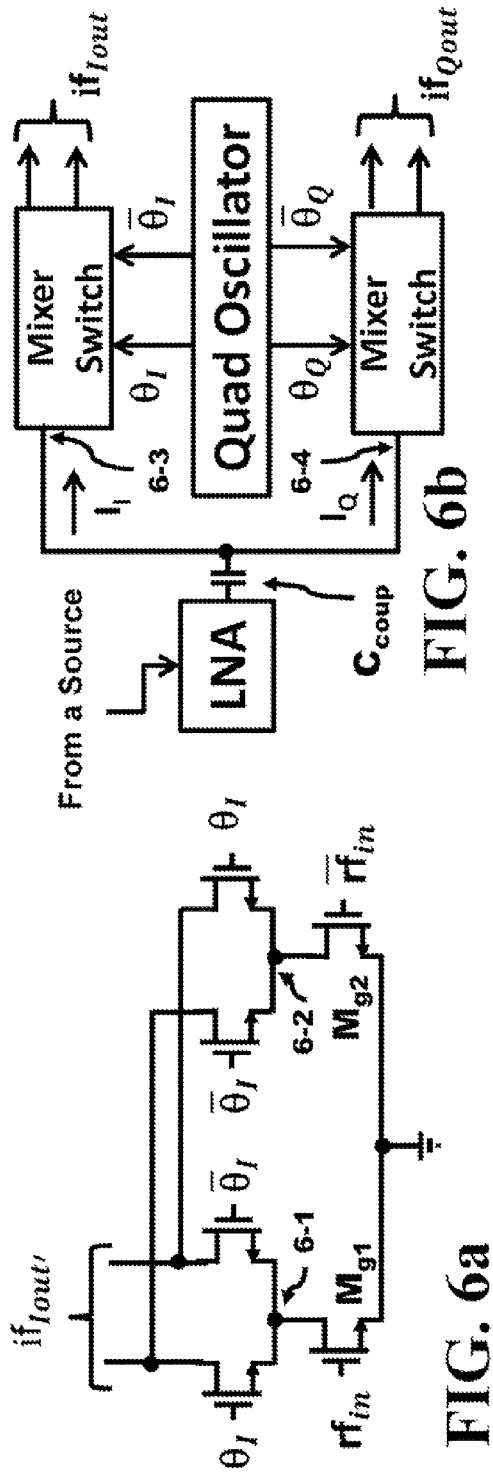
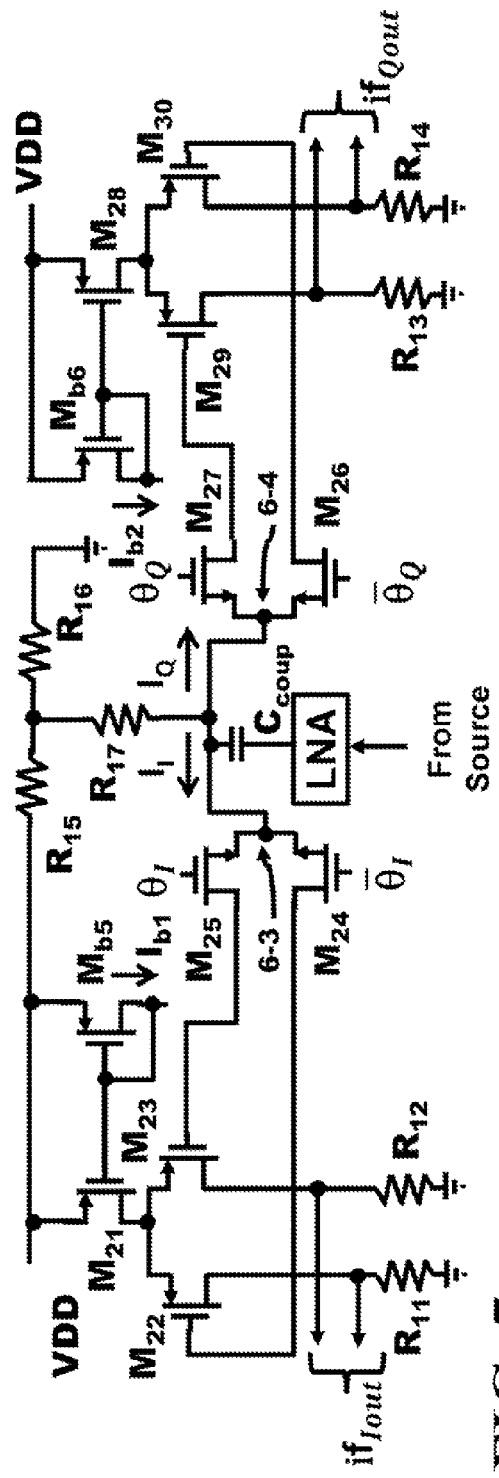

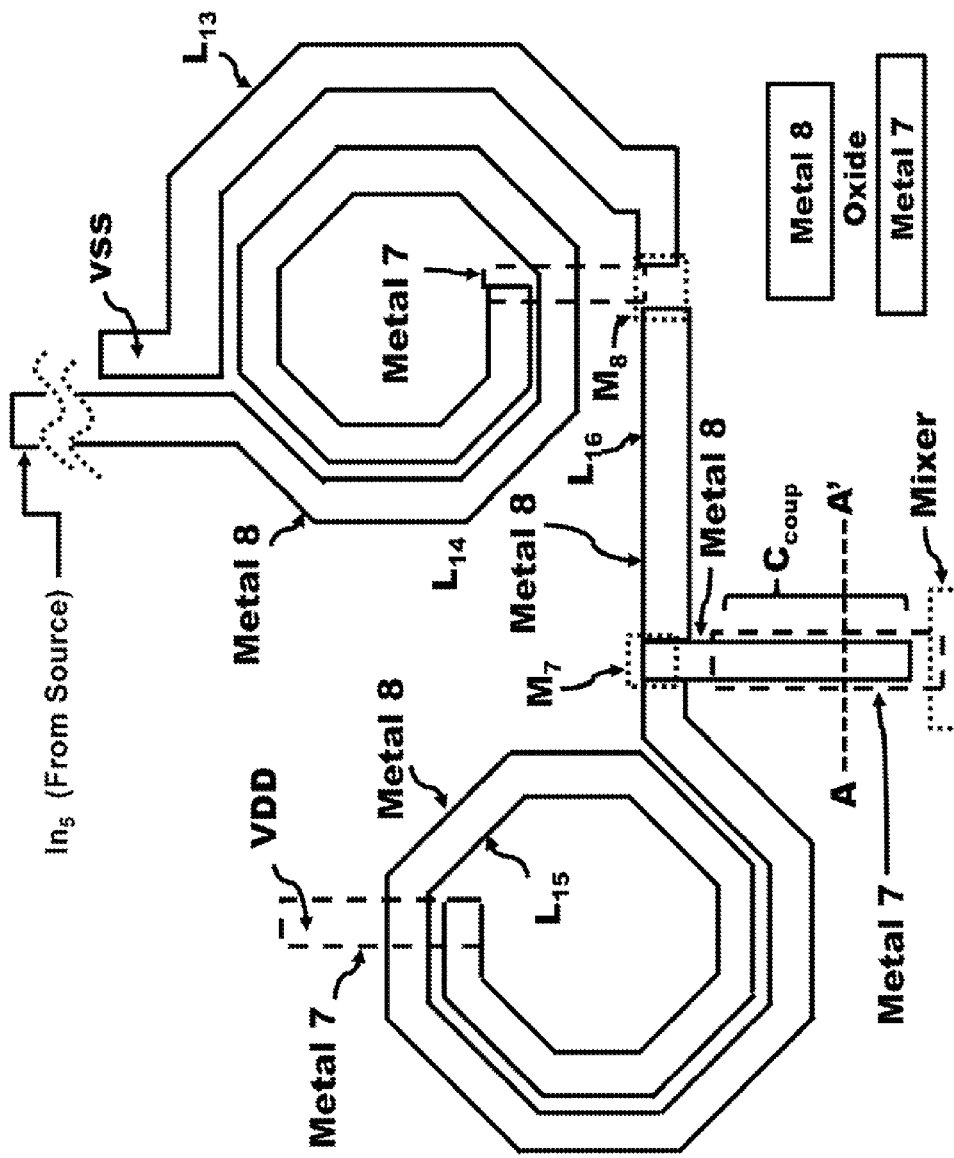
FIG. 8a
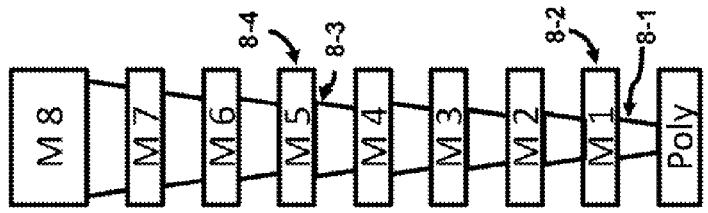
FIG. 8b
FIG. 8c

METHOD AND APPARATUS OF AN INPUT RESISTANCE OF A PASSIVE MIXER TO BROADEN THE INPUT MATCHING BANDWIDTH OF A COMMON SOURCE/GATE LNA

CROSS REFERENCE TO RELATED APPLICATIONS

The present application is related to the co-filed U.S. application Ser. No. 13/312,820 entitled "An Injection Locked Divider with Injection Point Located at a Tapped Inductor" both filed on Dec. 6, 2011, which are invented by the same inventor as the present application and incorporated herein by reference in their entireties.

BACKGROUND OF THE INVENTION

The Federal Communications Commission (FCC) has allotted a spectrum of bandwidth in the 60 GHz frequency range (57 to 64 GHz). The Wireless Gigabit Alliance (WiGig) is targeting the standardization of this frequency band that will support data transmission rates up to 7 Gbps. Integrated circuits, formed in semiconductor die, offer high frequency operation in this millimeter wavelength range of frequencies. Some of these integrated circuits utilize Complementary Metal Oxide Semiconductor (CMOS), Silicon-Germanium (SiGe) or GaAs (Gallium Arsenide) technology to form the dice in these designs. At 60 GHz, the interface issues between the LNA and the mixer are presented.

CMOS (Complementary Metal Oxide Semiconductor) is the primary technology used to construct integrated circuits. N-channel devices and P-channel devices (MOS device) are used in this technology which uses fine line technology to consistently reduce the channel length of the MOS devices. Current channel lengths are 40 nm, the power supply of VDD equals 1.2V and the number of layers of metal levels can be 8 or more.

Cost is a driving force in electronic products. Integration of circuit has allowed many more devices into the die. In addition, massive computation is typically requires when operating wireless systems. This has forced analog designers to introduce their circuit techniques into 8 layer metal CMOS processes more geared for digital logic manipulation rather than analog functions. The design of high speed analog circuits (60 GHz) in the 8 layer 40 nm CMOS process is a difficult task that requires innovation, careful design and analysis.

Conventional techniques in high frequency circuit design can unnecessarily waste energy. Any technology being pushed to the limit, as in the design of 60 GHz receiver frond-ends that includes an LNA (Low Noise Amplifier) and mixer, makes these energy losses more pronounced. These losses influence target objectives and can cause the chip or die to fail meeting the specifications. New circuit techniques are required to reduce these energy losses and allow the circuit to achieve 60 Ghz operation in the WiGig specification.

BRIEF SUMMARY OF THE INVENTION

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

One of the embodiments of the disclosure is a common source LNA interfacing to a mixer where the mixer responds to input current signals generated by the output of the LNA. An output signal spectrum is developed across the resonant circuit load of the LNA and is coupled to a mixer. The signal spectrum of the input signal is amplified and generates an output signal spectrum that is carried within the current signals being applied to the mixer. The voltage output of the LNA's load is translated to a current output that is applied to the input of the mixer. These input current signals apply the energy associated with the current directly into the mixer to minimize the overall power dissipation.

Another embodiment uses a series peaking inductor coupling the cascode devices of the LNA together. The area occupied by the inductors are orders of magnitude larger that the area occupied by the devices in the LNA. A device represents a CMOS transistor where the transistor can be either P or N-type channel transistor. In addition, the physical displacement between the upper cascode device and the lower cascode device of the LNA can be quite large. A series peaking inductor formed from a wide metal layer is used to couple the drain of the lower cascode device to the source of the upper cascode device. A capacitance can be added to the wide trace of the inductor to form a bandpass filter in order to pass those frequencies of interest.

Another embodiment of the invention is the adjustment of the width of the top cascode device with respect to the width of the bottom input device in the cascode LNA to adjust the optimum (NF) Noise Figure and the center frequency of the resonant circuit to the desired frequency of operation. The NF can be further improved 0.16 dB by reducing the width of the upper cascode device below the width of the lower cascode device. In addition, the center carrier frequency of the LNA is decreased.

An additional embodiment uses the impedance of the mixer to reduce the Q (or quality factor) of the resonant circuit. By reducing the Q, the bandwidth of the receiver is increased. The adjustment of the width of the top cascode device and the load of the impedance of the mixer reduces the Q and eliminates the need for either a capacitive or resistive array to perform this function thereby reducing the introduction of unnecessary parasitic elements. This allows the receiver to meet the requirements for the WiGig initiative at a reduced power.

A receiver comprising: a LNA (Low Noise Amplifier) configured in a cascode structure coupled to a resonant circuit; the resonant circuit provides an output signal spectrum; and a width of a to cascode device in the LNA is reduced with resect to a constant width of a lower cascode device to decrease a center frequency of the resonant circuit, further comprising: a first switched capacitor circuit capacitively coupled to the resonant circuit, whereby an oscillator clocks the first switched capacitor circuit presenting an impedance to the resonant circuit; and the impedance of the switched capacitor circuit increases a bandwidth of the resonant circuit, further comprising: an input signal spectrum coupled to an input of the LNA, further comprising: the resonant circuit capacitively coupled to a second switched capacitor circuit; a clock signal of an oscillator enables a first mixer switch of the first switched capacitor circuit coupled to a first input of a first differential amplifier; an inverse clock signal of the oscillator enables a second mixer switch of the second switched capacitor circuit coupled to a second input of the first differential amplifier; and an output of the first differential amplifier provides an in-phase sum frequency and an in-phase difference frequency spectrum between an output signal spectrum of the resonant circuit and the clock signal, whereby the first and second switched capacitor circuits comprise a first mixer, whereby energy from the resonant circuit powers the first mixer. The receiver further comprising: the resonant circuit capacitively coupled to a third switched capacitor circuit; the resonant circuit capacitively coupled to a fourth switched capacitor circuit; a quadrature clock signal of the oscillator enables a third mixer switch of the third switched capacitor circuit coupled to a first input of a second differential amplifier; a quadrature inverse clock signal of the oscillator enables a fourth mixer switch of the fourth switched capacitor circuit coupled to a second input of the second differential amplifier; and an output of the second differential amplifier provides a quadrature sum frequency and a quadrature difference frequency spectrum between the output signal spectrum and the quadrature clock signal.

A receiver comprising: a LNA (Low Noise Amplifier) coupled to a resonant circuit providing an output signal spectrum; the resonant circuit capacitively coupled to a first switched capacitor circuit; an oscillator clocks the first switched capacitor circuit coupling an impedance bandwidth of the resonant circuit, whereby the LNA is configured in a cascode structure, whereby a width of a top cascode device in the LNA is adjusted with respect to a width of a lower cascode device to shift a center frequency of the resonant circuit. The receiver further comprising: an input signal spectrum coupled to an input of the LNA. The receiver further comprising: the output signal spectrum capacitively coupled to a second switched capacitor circuit, a clock signal of the oscillator enables a first mixer switch of the first switched capacitor circuit coupled to a first input of a first differential amplifier; an inverse clock signal of the oscillator enables a second mixer switch of the second switched capacitor circuit coupled to a second input of the first differential amplifier; and an output of the first differential amplifier provides an in-phase sum frequency and an in-phase difference frequency spectrum between the output signal spectrum and the clock signal, whereby the first and second switched capacitor circuits comprise a first mixer, whereby energy from the resonant circuit powers the first mixer, and further comprising: the resonant circuit capacitively coupled to a third switched capacitor circuit; the resonant circuit capacitively coupled to a fourth switched capacitor circuit; a quadrature clock signal of the oscillator enables a third mixer switch of the third switched capacitor circuit coupled to a first input of a second differential amplifier; a quadrature inverse clock signal of the oscillator enables a fourth mixer switch of the fourth switched capacitor circuit coupled to a second input of the second differential amplifier; and an output of the second differential amplifier provides a quadrature sum frequency and a quadrature difference frequency spectrum between the output signal spectrum and the quadrature clock signal.

A method of operating a receiver comprising the steps of: amplifying an input signal in an LNA (Low Noise Amplifier) coupled to a resonant circuit; coupling current from the resonant circuit through a first switch to a first capacitor integrating a first voltage; coupling current from the resonant circuit through a second switch to a second capacitor integrating a second voltage; enabling first switch with a clock signal; enabling second switch with an inverse clock signal; applying first voltage to a positive input of a differential amplifier; applying a second voltage to a negative input of the differential amplifier; and providing a sum and a difference frequency spectrum between a signal spectrum carried within the current and a frequency of the clock signal, whereby the LNA is configured in a cascode structure: whereby the first and second switches comprise a first mixer, whereby energy from the resonant circuit powers the first mixer.

BRIEF DESCRIPTION OF THE DRAWINGS

Please note that the drawings shown in this specification may not necessarily be drawn to scale and the relative dimensions of various elements in the diagrams are depicted schematically. The inventions presented here may be embodied in many different forms and should not be construed as limited to the embodiments set forth herein. Rather, these embodiments are provided so that this disclosure will be through and complete, and will fully convey the scope of the invention to those skilled in the art. In other instances, well-known structures and functions have not been shown or described in detail to avoid unnecessarily obscuring the description of the embodiment of the invention. Like identifiers or numbers refer to like elements in the diagrams.

FIG. 3a presents a common source device stage with a cascode structure in accordance with the present invention.

FIG. 3b shows a common gate device stage with a cascode structure in accordance with the present invention.

FIG. 3c presents a block diagram of the LNA in accordance with the present invention.

FIG. 4a illustrates a common source device stage with a cascode structure using a peaking inductor in accordance with the present invention.

FIG. 4b shows a common gate device stage with a cascode structure using a peaking inductor in accordance with the present invention.

FIG. 6a shows a portion of a conventional Gilbert mixer.

FIG. 6b illustrates a block diagram of the LNA, Quadrature oscillator and I and Q mixers in accordance with the present invention.

FIG. 7a presents the circuit of the LNA, Quadrature oscillator outputs and I and Q mixers in accordance with the present invention.

FIG. 8a illustrates the physical layout of the inductors and devices in the LNA in accordance with the present invention.

FIG. 8b illustrates the cross sectional view along A-A' in FIG. 8a in accordance with the present invention.

FIG. 8c presents a via stack in the CMOS process in accordance with the present invention.

DETAILED DESCRIPTION OF THE INVENTION

Figure 1A:
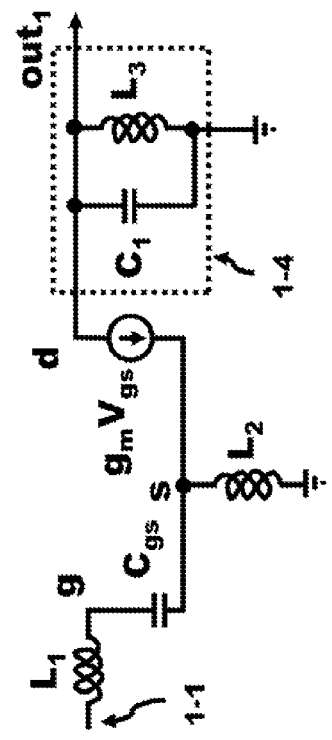
FIG. 1a depicts a common source device stage in accordance with the present invention.
Figure 2A:
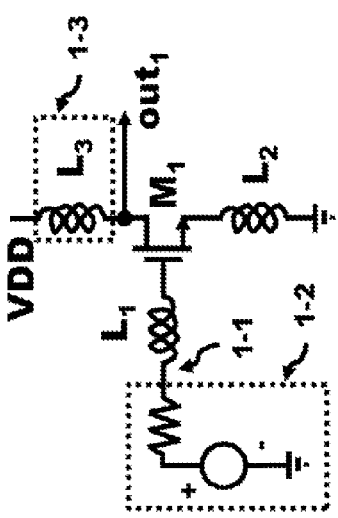
FIG. 2a illustrates a common gate device stage in accordance with the present invention.

The inventions presented in this specification can be used in various high frequency system designs. Some of the basic circuits for an analog amplifier include the common source and common gate structures as illustrated in FIG. 1a and FIG. 2a, respectively. The common source configuration of a LNA (Low Noise Amplifier) in FIG. 1a illustrates a voltage source 1-2, a voltage in series with a resistor, that can represent the output of an antenna or another source of an extracted signals. The output 1-1 of the voltage source 1-2 couples to the input of the gate of $M_1$ by the gate inductance $L_1$. The voltage source 1-2 provides the input frequency spectrum to the receiver. The source of $M_1$ is coupled to ground by the inductor $L_2$. At DC, the impedance of the inductor $L_2$ is zero causing the source of $M_1$ to be coupled to ground (GRD or VSS). This configuration is known as the common source. The drain of device $M_1$ is coupled to VDD by a load 1-3, in this case, the inductor $L_3$ and the output $out_1$ is provided at the drain of $M_1$.

Figure 1B:
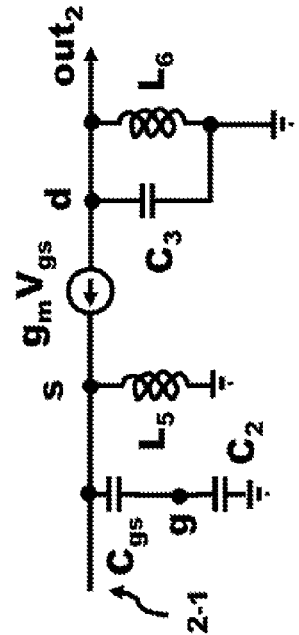
FIG. 1b shows a high frequency model of the common source MOS device in accordance with the present invention.

A small signal model of the common source is provided in FIG. 1b. The gate (g), source (s) and drain (d) of the device are labeled. Between the gate and source is the gate to source capacitance $C_{gs}$. A current source $g_mV_{gs}$ between the source and drain is controlled by the voltage between the gate and source $V_{gs}$. The input is applied at 1-1 while the output is provided at $out_1$. The voltage source and any parasitic resistances (for example, the resistance of the inductors) and several of the capacitances known in the art (i.e. $C_{gd}$) are not illustrated to simply the diagram. Finally, the load on the drain of the device is the parallel combination of the capacitance, $C_1$, at the drain and the inductance $L_3$ which is a resonant circuit 1-4. The resistance, not illustrated, is in parallel with the capacitance and inductance completing the parallel RLC tank circuit or resonant circuit of the LNA. The load or resonant circuit for the remaining cases of the LNA's are similar and will generally not be explicitly shown.

The common gate configuration of a LNA in FIG. 2a illustrates a voltage source 1-2, a voltage in series with a resistor, that can represent the output of an antenna or another source of an extracted signal also called the input signal spectrum. The voltage source 1-2 couples to the source 2-1 of $M_2$. The source is coupled to ground by the inductor $L_5$. The gate of $M_2$ is coupled to an AC ground by the capacitor $C_2$ and to the power supply VDD by the inductor $L_4$. At DC, the impedance of the inductor $L_4$ is zero causing the gate of $M_2$ to be coupled to a power supply (VDD). In general, the inductance of $L_4$ can be minimized, and in some cases, the inductor $L_4$ can be replaced by a short. The configuration in FIG. 2a is known as the common gate. The drain of device $M_2$ is coupled to VDD by the inductor $L_6$. The output of the circuit is available at $out_2$.

Figure 2B:
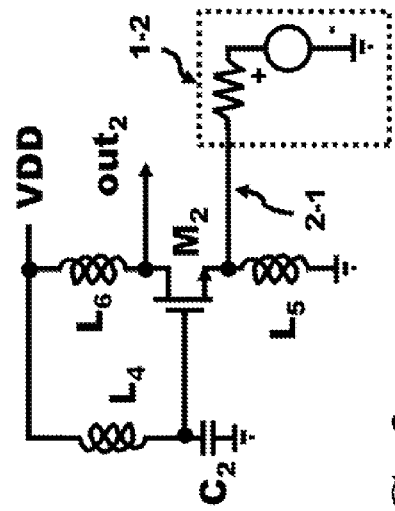
FIG. 2b shows a high frequency model of the common gate MOS device in accordance with the present invention.

A small signal model of the common gate is provided in FIG. 2b. The gate (g), source (s) and drain (d) of the device are labeled. The input is applied at 2-1 while the output is provided at $out_2$. Between the gate and source is the gate to source capacitance $C_{gs}$. A current source $g_mV_{gs}$ between the source and drain is controlled by the voltage between the gate and source $V_{gs}$. The inductor $L_5$ is between the source and ground. The voltage source and any parasitic resistances (for example, the resistance of the inductors) and several of the capacitances known in the art (i.e. $C_{gd}$) are not illustrated to simply the diagram. Finally, the load on the drain of the device is the parallel combination of the capacitance, $C_3$, at the drain and the inductance $L_6$. FIG. 2b illustrates that the current gain of the common gate approaches one.

FIG. 3a presents a cascode common gate structure. The cascode structure comprises the two stacked devices, $M_4$ and $M_3$, and couples to VSS and VDD through the inductors, $L_8$ and $L_9$. Typically, these inductors can occupy an area 50 um on a side while the devices can be incorporated into an area of 5 um on a side. The area occupied by these inductors compared to the area occupied by the devices can be two orders of magnitude larger. This illustrates that the placement of the inductors play a very important role in determining just how close the devices in the cascode structure can be placed next to one another. The input is applied at $in_3$ through the inductor $L_7$ to the gate of $M_4$ while the output is provided at $out_3$. Quite often, the two devices of the cascode cannot be placed next to each other. Thus, a metal interconnect may be required to couple the drain of $M_1$ to the source of $M_3$. This interconnect is represented by the resistance $R_3$. This resistance introduces losses and can decrease the gain of the circuit.

In FIG. 3a, the cascode structure provides several advantages including; better isolation between input and output nodes, a high output impedance, and a higher bandwidth. A current mirror is formed by devices $M_{b1}$ and $M_4$ controlled by $I_{bias1}$. The resistor $R_1$ acts as a low pass filter to stabilize the voltage from the diode connected device $M_{b1}$ and applies the voltage to the gate of device $M_4$. The device $M_4$ is configured in a common source configuration while the device $M_3$ is in a common gate configuration. The voltage at node 3-1 is nearly constant reducing the miller feedback capacitance for the device $M_4$. Because the miller capacitance is reduced in this circuit, the cascode configuration allows a higher bandwidth.

FIG. 3b presents a cascode common gate structure. The cascode structure comprises the two stacked devices, $M_6$ and $M_5$, and couples to VSS and VDD through the inductors, $L_{11}$ and $L_{12}$. A current mirror is formed by devices $M_b$, and $M_6$ controlled by $I_{bias2}$. The resistor $R_2$ acts as a low pass filter to stabilize the voltage from the diode connected device $M_{b2}$ and applies the voltage to the gate of device $M_6$. As mentioned earlier, the placement of the inductors play a very important role in determining just how close these devices in the cascode structure can be placed next to one another. Quite often, these devices cannot be placed next to each other. Thus, a metal interconnect, modeled by the resistor $R_4$, couples the drain of $M_6$ to the source of $M_5$. This interconnect is represented by the resistance $R_4$.

In FIG. 3b, the input is applied at $in_4$ through the inductor $L_{10}$ to the source of $M_6$ while the output is provided at $out_4$. In general, the inductance of $L_{10}$ can be minimized, and in some cases, the inductor $L_{10}$ can be replaced by a short. The cascode structure provides several advantages including; better isolation between input and output nodes, a high output impedance, and a higher bandwidth. The device $M_6$ is configured as a common gate while the device $M_3$ is also in a common gate configuration. This circuit can provide a current gain approaching one.

FIG. 3c illustrates the block diagram of the LNA. A signal "from a source" that could be an antenna, the electrical output of a fiber network, or a very weak signal is amplified by the LNA and provided at its output out. The LNA is optimized to keep the noise figure low while also providing a gain to the weak signal.

FIG. 4a presents a second cascode common source structure. The cascode structure comprises the two stacked devices, $M_8$ and $M_7$, and couples to VSS and VDD through the inductors, $L_{13}$ and $L_{15}$. A current mirror is formed by devices $M_{b3}$ and $M_8$ controlled by $I_{bias3}$ and applied to the gate of device Mg. The resistor $R_5$ acts as a low pass filter to stabilize the voltage from the diode connected device M. The area occupied by the inductors can be two orders of magnitude larger than the area occupied by the devices. Often these two devices cannot be placed next to each other. Thus, a metal interconnect is used to couple the drain of $M_8$ to the source of $M_7$. This interconnect, if modeled as a resistor, can decrease the gain of the circuit. By increasing the width of this metallic interconnect, the resistance is decreased at the expense of increased capacitance. However, another feature of this interconnect becomes more prominent: its self-inductance, $L_{16}$. Thus, FIG. 4a illustrates the substitution of the resistor model of $R_3$ in FIG. 3a by the inductor $L_{16}$. This inductance can now be used as a peaking inductor which resonates with the corresponding capacitance of the interconnect and devices loading this interconnect. The function of the peaking inductor and capacitive load forms a band-pass filter which is adjusted to operate at 60 GHz. Thus, although the placement of the two cascode devices are displaced from one another on the die, the peaking inductor can minimize the loss of the resistive component in the interconnect between the cascode devices and provide a band-pass function.

In FIG. 4a, the input is applied at $in_5$ and arrives at the gate of $M_8$ through the inductor $L_{14}$ while the output is provided at $out_5$. In general, the inductance of $L_{14}$ can be minimized, and in some cases depending on the layout, the inductor $L_{14}$ can be replaced by a short. A current mirror is formed by devices $M_{b3}$ and $M_8$ controlled by $I_{bias3}$. The cascode structure provides several advantages including; better isolation between input and output nodes, a high output impedance, and a higher bandwidth. The device $M_8$ is configured as a common source while the device $M_7$ is in a common gate configuration.

FIG. 4b presents a cascode common gate structure. The cascode structure comprises the two stacked devices, $M_{10}$ and $M_9$, and couples to VSS and VDD through the inductors, $L_{17}$ and $L_{19}$. A current mirror is formed by devices $M_{b4}$ and $M_{10}$ controlled by $I_{bias4}$. The resistor $R_6$ acts as a low pass filter to stabilize the voltage from the diode connected device $M_{b4}$. As mentioned earlier, the placement of the inductors play a very important role in determining just how close these devices in the cascode structure can be placed next to one another. Quite often, these devices cannot be placed next to each other. The interconnect, if modeled as a resistor, can decrease the gain of the circuit. By increasing the width of this metallic interconnect, the resistance is decreased at the expense of increased capacitance. However, as before, another feature of this interconnect becomes more prominent: its self-inductance, $L_{20}$. Thus, a metal interconnect, previously modeled as a resistor $R_4$ in FIG. 3b, is now modeled as the inductor $L_{20}$. This inductance can now be used as a peaking inductor which resonates with the corresponding capacitance of the interconnect and devices loading this interconnect. Thus, although the placement of the two cascode devices are displaced from one another on the die, the peaking inductor can minimize the loss of the resistive component in the interconnect between the cascode devices and provide a band-pass function that can be adjusted to operate at 60 GHz.

In FIG. 4b, the input is applied at $in_6$ and arrives at the source of $M_{10}$ through the inductor $L_{18}$ while the output is provided at $out_6$. In general, the inductance of $L_{18}$ can be minimized, and in some cases depending on the layout, the inductor $L_{18}$ can be replaced by a short. A current mirror is formed by devices $M_{b4}$ and $M_{10}$ controlled by $I_{bias4}$. The cascode structure provides several advantages including; better isolation between input and output nodes, a high output impedance, and a higher bandwidth. The device $M_{10}$ is configured as a common gate while the device $M_9$ is also in a common gate configuration.

Ideally, the LNA would like to pass all frequencies equally over the targeted spectrum range from 57 Ghz to 64 GHz and block all other frequencies. However this condition is very difficult to achieve. Typically, a resonant circuit (comprising an inductor, capacitor and resistance) is also known as an RLC tuned circuit. The response of a resonant circuit is measured near the center frequency $\omega_c$ of the RLC resonant circuit. The bandwidth B is given as $B=(\omega_c)/Q$. The term Q is known as the quality factor.

As Q is decreased, the bandwidth of the resonant circuit increases while the gain decreases. This allows a resonant circuit to be adjusted so the bandwidth covers the desired spectrum range and the LNA can amplify any signal within the bandwidth, but the gain of the LNA has been decreased while the noise increased. On the other hand, as Q is increased, the bandwidth of the resonant circuit decreases while the gain increases. This creates a very selective band-pass circuit where only a portion of the desired spectrum would be captured.

The resistance R in the parallel RLC resonant circuit can control the value of Q according to the relation $$Q = R\sqrt{\frac{C}{L}}.$$

Figure 4C:
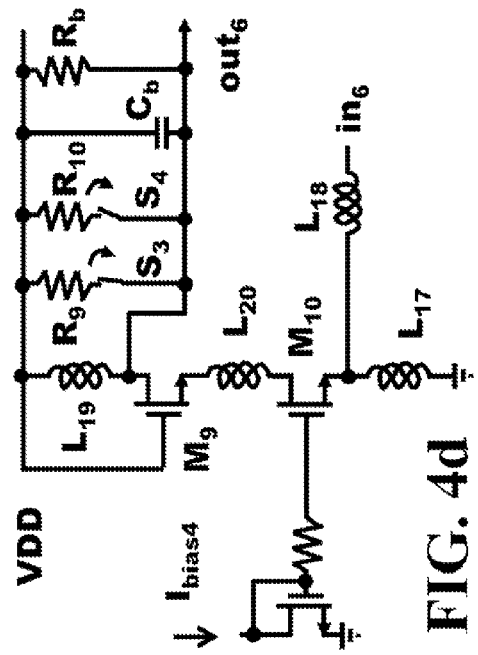
FIG. 4c depicts a common source device stage with a cascode structure using a peaking inductor and a switched resistive array to adjust the bandwidth of the resonant circuit in accordance with the present invention.

The parasitic portion of R in FIG. 4c is given by $R_a$ plus any dynamic resistance that are switched into the resonant circuit while the parasitic capacitance C is given by $C_a$. As the R decreases, Q decreases. A resistive array formed by $R_7$ and $R_8$ can be switched into the RLC resonant circuit by enabling switches $S_1$ and $S_2$ (as shown by the arrows) to provide a dynamic resistance adjustment to the RLC resonant circuit in FIG. 4c. The switch $S_1$ or $S_2$ can be an MOS device that is enabled (to provide a path) and can couple the resistance of $R_7$ or $R_8$ into the parallel RLC resonant circuit. When the resistive array is enabled to place either or both $R_7$ or $R_8$ in parallel with $R_a$, the resistance of the resonant circuit decreases and decreases the Q thereby increasing the bandwidth.

Figure 4D:
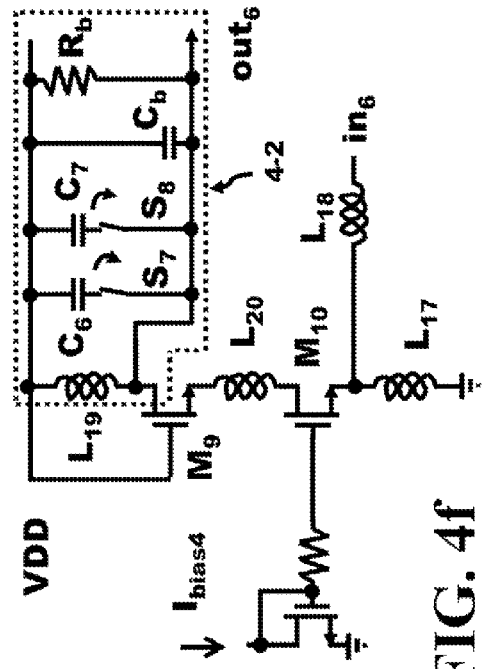
FIG. 4d presents a common gate device stage with a cascode structure using a peaking inductor and a switched resistive array to adjust the bandwidth of the resonant circuit in accordance with the present invention.

The common gate cascade LNA is illustrated in FIG. 4d. The parasitic capacitance C of the parallel RLC resonant circuit is given by $C_b$. The parasitic portion of R is given by $R_b$ in parallel with the two enabled switches $S_3$ and $S_4$ coupling $R_9$ or $R_{10}$ into the resonant circuit. The switches $S_3$ and $S_4$ become disabled (as shown by the arrows) to provide a dynamic resistance adjustment to the RLC resonant circuit in FIG. 4d. The resistors $R_9$ and $R_{10}$ are removed from being in parallel with $R_b$ causing the R in the RLC resonant circuit to increase. As the R increases, Q increases causing the bandwidth of the resonant circuit to decrease. Although only two resistors with two switches have been show, the number of switches and resistors can greater than two. In some cases, the resistance of the MOS devices forming the switches can provide the resistance while, in addition, the weight of the resistors can be binary weighted in value.

The capacitance C in the RLC resonant circuit can control the value of $\omega_c$, if R is very small or can be neglected, according to the relation $$\omega_c = 1/\sqrt{LC}.$$

Figure 4E:
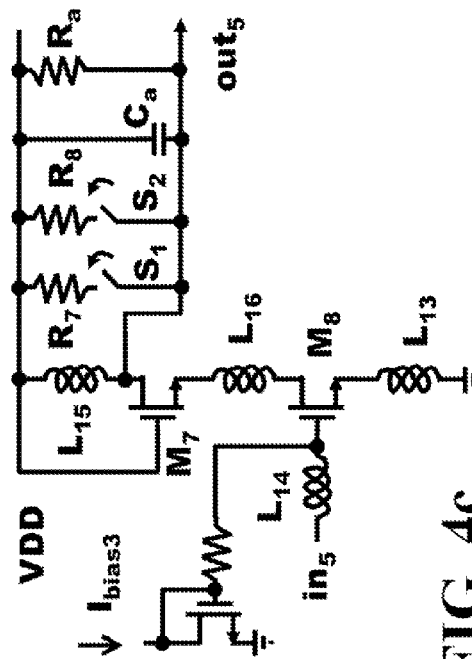
FIG. 4e depicts a common source device stage with a cascode structure using a peaking inductor and a switched capacitive array to adjust the center frequency of the resonant circuit in accordance with the present invention.

Increasing C, decreases $\omega_c$ and vice versa. A capacitor array formed by $C_4$ and $C_5$ can be switched into the parallel RLC resonant circuit by enabling switches $S_5$ and $S_6$ (as shown by the arrows) to provide a dynamic capacitance adjustment to the RLC resonant circuit in FIG. 4e. The parasitic portion of C the RLC resonant circuit is given by $C_a$ while the resistance R is given by the parasitic values $R_a$. The capacitive switching array of the common source in FIG. 4e is provided by the two disabled switches $S_5$ and $S_6$ that can be enabled to place either or both $C_4$ or $C_5$ in parallel with $C_a$ causing C to increase which decreases the $\omega_c$. The center frequency is then shifted to lower frequencies.

Figure 4F:
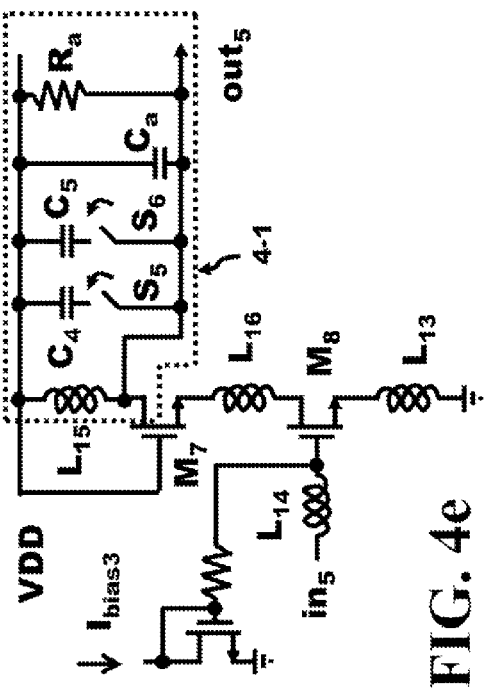
FIG. 4f shows a common gate device stage with a cascode structure using a peaking inductor and a switched capacitive array to adjust the center frequency of the resonant circuit in accordance with the present invention.

The common gate cascade LNA is illustrated in FIG. 4f. The capacitive switching array of the common gate is provided by the two enabled switches $S_7$ and $S_8$ that can be disabled (as shown by the arrows) to remove either or both $C_6$ or $C_7$ from being in parallel with $C_b$ causing the C in the RLC resonant circuit to decrease which increases the $\omega_c$. The center frequency is shifted to higher frequencies. Although only two capacitors with two switches have been show, the number of switches and capacitors can be varied while the weight of the capacitors can be binary weighted in value. Inserting/removing the capacitors by switch enablement/disablement provides the dynamic portion of the C in the RLC resonant circuit in FIG. 4e (common source) and FIG. 4f (common gate). Similar elements that have been identified with the same label in FIG. 4a, FIG. 4c and FIG. 4e are similar components while those with the same label in FIG. 4b, FIG. 4d and FIG. 4f are similar components.

The capacitive arrays occupy an area which introduces undesired capacitance into the network. The parasitic capacitances of the array elements introduces a dynamic capacitance $C_d$ that can be comparable to the parasitic capacitance $C_a$ of the resonant circuit causing the center frequency $\omega_c=1/\sqrt{(L(C_a+C_d))}$ to be controlled by the both terms $C_d$ and $C_a$. This additional dynamic capacitance can prevent the LNA from reaching the target frequency of 60 GHz. Similarly, the resistive arrays also introduce undesired parasitic capacitances because of their physical layout in the die. Thus, this parasitic capacitance introduced by the use of either the resistive or capacitive array makes the tuning or adjusting of the bandwidth and center frequency of the RLC resonant circuit more difficult for the WiGig bandwidth. The additional dynamic capacitance introduced into the parallel resonant circuit will make it more difficult for the circuit to operate at 60 GHz. A different inventive approach of adjusting the bandwidth and center frequency will be required.

One inventive approach in an attempt to overcome this barrier is to remove the capacitive array in FIG. 4e and the resistive array in FIG. 4c altogether thereby eliminating the additional dynamic capacitance of their layout. The requirement to adjust the bandwidth and center frequency of the RLC resonant circuit will be adjusted using two innovative embodiments.

The first innovative adjustment involves sizing the width of the upper cascade device while maintaining the lower cascade device at the same width. This adjustment of the upper cascade transistor width causes the center frequency of the parallel resonant RLC circuit to shift. As the width of the upper cascade device is decreased relative to the lower cascade device, the center frequency of the parallel resonant RLC circuit decreases.

The second innovative adjustment involves coupling the resonant circuit of the LNA to a switched capacitance circuit. The switched capacitor includes a switch whose gate is driven by a clock and where the switch drives a capacitive load. This switched capacitor circuit includes a mixer switch (MOS device) and capacitive load of the differential amplifier. The switched capacitor circuit places a resistance across the resonant circuit and is given by $R=1/(Cf_\Theta)$ where C is the capacitive gate load of the differential amplifier and $f_\Theta$ is the clock frequency of the quadrature oscillator. This resistive component can be used to adjust the Q or bandwidth of the parallel resonant RLC circuit of the LNA.

Then, in FIG. 4e, assuming that the capacitive array of $C_4$ and $C_5$ is removed, the width of the $M_7$ device can be adjusted with respect to the $M_8$ device to adjust the center frequency. The resistance of the switched capacitor can be used to adjust the Q or bandwidth of the parallel resonant RLC circuit. These size changes and adjustments are made final using simulation results to cover all process, temperature and voltage variations. After final layout and die fabrication, the operation of this inventive circuit technique has been confirmed by actual measurement.

The results of decreasing the channel width of $M_7$ with a parasitic capacitive load are provided in FIGS. 5a-d. The upper cascode device ($M_7$) in the common source LNA of FIG. 4e was varied in width while the width of the lower device ($M_8$) remained constant and the circuit was simulated to determine the NF (Noise Figure) and the Gain of the common source LNA. The dashed and solid lines in all of FIGS. 5a-d correspond to two different ratios of the width of the upper device (M7) to the width of the lower device (M8) or $W_{M7}/W_{M8}$. These two ratios have been reduced to a common denominator of 8. The ratio $W_{M7}/W_{M8}$ of the dashed line is 6/8 while that of the solid line corresponds to a ratio of 5/8.

Figure 5A:
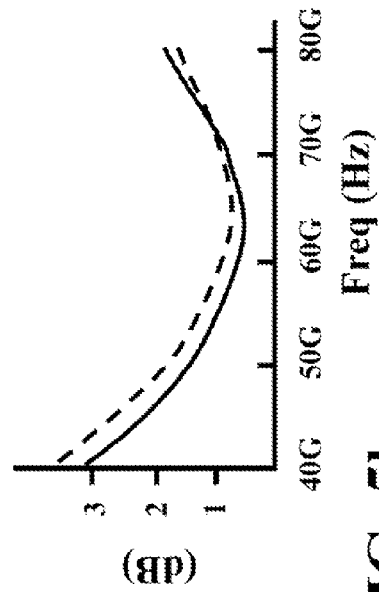
FIG. 5a presents the graphical results of the Noise Figure of an LNA for two different width ratios of the upper cascode device to the lower cascode device versus frequency of WCS (Worst Case Slow) operation in accordance with the present invention.
Figure 5B:
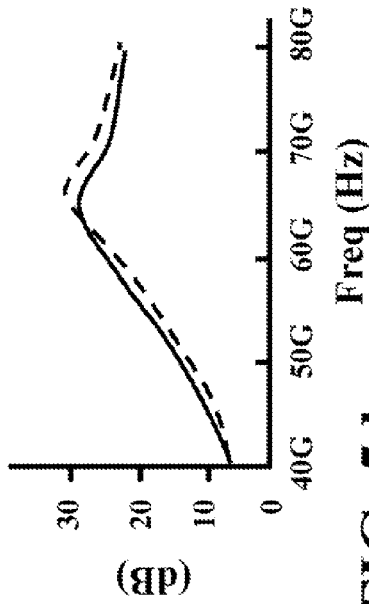
FIG. 5b illustrates the graphical results of the Noise Figure of an LNA for two different widths of the upper cascode device to the lower cascode device versus frequency of BCF (Best Case Fast) operation in accordance with the present invention.

FIG. 5a provides the NF at (WCS) Worst Case Slow Case (longer channel lengths, low power supply voltage and high temperature). The dotted line shows a minimum in the NF at about 68 GHz while the solid line shifts the minimum towards 63 GHz. Thus, as the upper device is reduced to a ratio of 5/8, the NF is reduced by 0.16 dB at 60 GHz when compared to the initial ratio of 6/8. FIG. 5b provides the NF results for the (BCF) Best Case Fast Case (shorter channel lengths, high power supply voltage and low temperature).

Figure 5C:
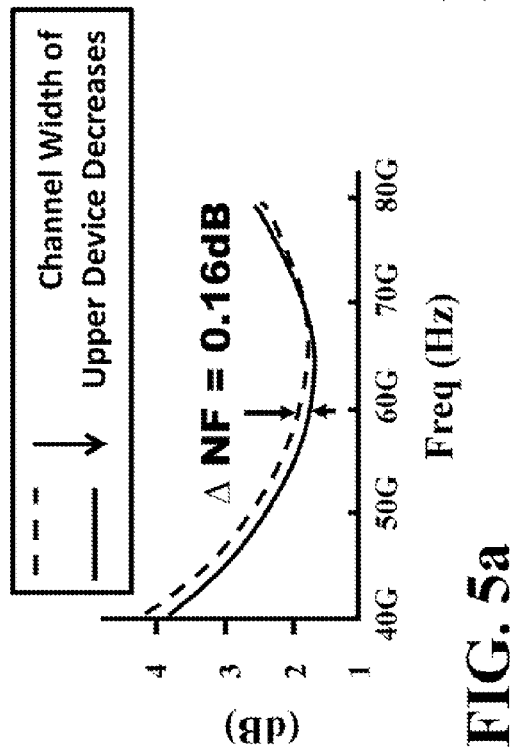
FIG. 5c presents the graphical results of the forward gain of an LNA for two different widths of the upper cascode device to the lower cascode device versus frequency of WCS (Worst Case Slow) operation in accordance with the present invention.
Figure 5D:
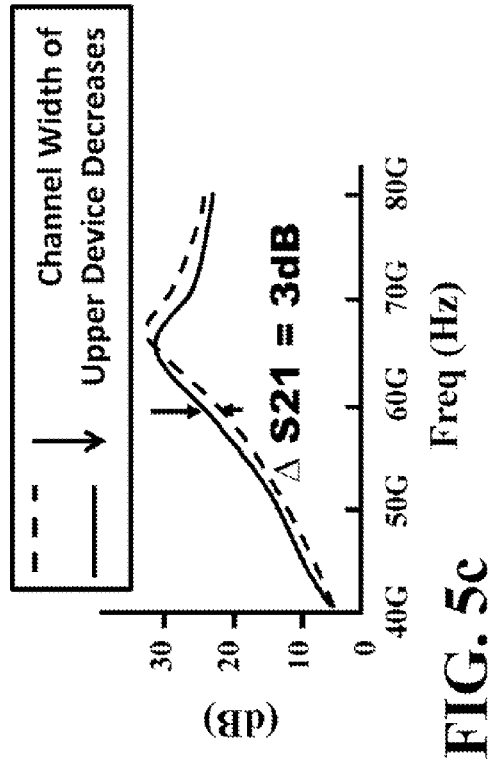
FIG. 5d illustrates the graphical results of the forward gain of an LNA for two different widths of the upper cascode device to the lower cascode device versus frequency of BCF (Best Case Fast) operation in accordance with the present invention.

FIG. 5c provides the S21 or forward transmission coefficient (forward gain) at WCS. Note that the peak of the solid curve corresponding to a ratio of 5/8 is shifted to the left, decreasing the center frequency. At 60 GHz, the forward gain is increased by 3 dB. FIG. 5d provides the S21 results for the BCF case. Thus, for the common source LNA of FIG. 4e, assuming that the capacitive array of $C_4$ and $C_5$ is removed, the ratio of $W_{M7}/W_{M8}$ was set to 5/8. Ideally, to achieve good linearity in the LNA requires that the upper device of the cascode have a width larger than the lower device. The upper device would introduce a smaller voltage drop and increase the available swing of the signal; however, the curves of FIG. 5a-d would then shift to the right increasing the NF and the center carrier frequency outside the desired range. The 1 db compression point is monitored to arrive at a design with an acceptable 1 db compression point where the NF is reduced, the gain is increased at 60 GHz and the bandwidth is shifted to lower frequencies.

A Gilbert mixer is illustrated in FIG. 6a comprising of the two devices $M_{g1}$ and $M_{g2}$ which are switched by the $rf_{in}$ and $\overline{rf}_{in}$ signals, respectively. The drain of device $M_{g1}$ is coupled to the common node 6-1 of the first mixer switch gated by the in-phase clock ($\Theta_I$ and its compliment). The drain of device $M_{g2}$ is coupled to the common node 6-2 of the second mixer switch gated by the in-phase clock ($\Theta_I$ and its compliment). The outputs of the first mixer switch are combined with the outputs of the second mixer switch as illustrated to generate the $if_{Iout}$ signal. A load attached to each of the two outputs couples the Gilbert mixer to a power supply to supply energy to the circuit. The intermediate frequency contains the sum and difference frequency spectrum between the output signal spectrum carried by the $rf_{in}$ and $\overline{rf}_{in}$ and the in-phase clock ($\Theta_I$ and its compliment). Note that the energy carried by the output signal spectrum is only applied to the gates of $M_{g1}$ and $M_{g2}$ and this energy does not directly contribute to powering or providing energy to operate the mixer. If this energy could power the mixer, the energy usage of the mixer can potentially be minimized. A similar circuit is used to generate the $if_{Qout}$ signal except that the mixer switches are clocked by the quadrature clock ($\Theta_Q$ and its compliment). A quadrature clock is shifted 90° degrees from the in-phase clock.

FIG. 6b illustrates a block diagram of one embodiment of the invention. A quadrature oscillator generates four equally displaced clock phases: $\Theta_I$, $\overline{\Theta}_I$, $\Theta_Q$ and $\overline{\Theta}_Q$ at 0°, 180°, 90° and 270°, respectively. The clocks $\Theta_I$ and $\overline{\Theta}_I$ are the in-phase and inverse in-phase clocks while the $\Theta_Q$ and $\overline{\Theta}_Q$ are known as the quadrature and inverse quadrature clocks. The load on each of these clock nodes is identical insuring that the clock output is evenly loaded, thereby preventing any skew between these clock signals from developing. The LNA outputs are applied to common nodes 6-3 and 6-4 of the upper and lower mixer switches. The LNA feeds the amplified signal from a source through the LNA to the coupling capacitor $C_{coup}$. The capacitor $C_{coup}$ couples the output signal of the LNA to the common nodes 6-3 and 6-4 of the two mixer switches. Since the upper mixer switch is clocked by the in-phase clocks, only the in-phase current component $I_I$ is converted into $if_{Iout}$ and since the lower mixer switch is clocked by the quadrature-phase clocks, only the quadrature-phase current component $I_Q$ is converted into $if_{Qout}$.

FIG. 7a depicts the device configuration for the block diagram given in FIG. 6b. The top mixer switch of FIG. 6b is on the left side of FIG. 7a and comprises MOS devices $M_{24}$ and $M_{25}$ connected to the common node 6-3 while the lower mixer of FIG. 6b is on the right side of FIG. 7a comprises MOS devices $M_{26}$ and $M_{27}$ connected to the common node 6-4. A voltage divider is formed by resistors $R_{15}$ and $R_{16}$ and is coupled through a large value resistor $R_{17}$ to provide DC biasing for the common nodes 6-3 and 6-4 of the left and right mixer switches and to the common plate electrode of the coupling capacitor $C_{coup}$.

The output of the LNA is coupled to a coupling capacitor $C_{coup}$. The coupling capacitor applies the average currents $I_I$ and $I_Q$ to the common nodes of the left 6-3 and right 6-4 mixer switches, respectively. Note that instead of applying the output signal of the LNA to the gate devices of the Gilbert mixer, for example see $M_{g1}$ or $M_{g2}$ in FIG. 6a, the signal is instead applied to the common nodes 6-3 and 6-4 of the left and right mixer switches as illustrated in FIG. 7a. Unlike the Gilbert mixer, this embodiment of mixer switches is driven by the average AC current output of the LNA to power the inventive mixer. The mixer switch $M_{25}$ clocked by the one of the quadrature clocks and the load capacitance of the mixer switch $M_{25}$ is the gate capacitance of $M_{23}$ which together form a switched capacitor circuit. The switched capacitor presents a load resistive to the resonant circuit of the LNA according to $R_L = 1/((C_{M23})(f_\Theta))$ where $R_L$ is the load resistance placed in parallel to the resonant circuit, $C_{M23}$ is the capacitance of the load device $M_{23}$ and $f_\Theta$ is the frequency of the quadrature clock. This resistance $R_L$ can be used to de-Q's or increase the bandwidth of the tank circuit in the LNA.

The signal of interest exists over a given range of frequencies and the information carried by the input signal is embedded within the signal spectrum. The left mixer comprises devices $M_{21}$-$M_{25}$ and $M_{b5}$ and resistors $R_{11}$ and $R_{12}$. The mixer switches $M_{25}$ and $M_{24}$ are enabled and disabled by two of the quadrature clock signals $\Theta_I$ and $\overline{\Theta}_I$. A mixer switch is equivalent to a switched capacitor circuit where the switch is driven by the clock signal to charge and discharge the gate capacitance ($M_{22}$, $M_{23}$) of the differential amplifier with remaining components $M_{21}$, $R_{11}$ and $R_{12}$. The average current $I_I$ charges/discharges the gate capacitance of $M_{22}$ and $M_{23}$ whenever the clock signals $\Theta_I$ and $\overline{\Theta}_I$ enable the mixer switch gates $M_{25}$ and $M_{24}$. The gate capacitance of $M_{22}$ and $M_{23}$ integrate the current $I_I$ to generate a first and a second voltage applied to the differential amplifier. The differential amplifier requires two signals: an input signal and a compliment (or inverse) input signal and generates an output signal and a compliment output signal. In addition, the impedance of the switched capacitance circuit of the mixer is used to de-Q the resonant circuit, thereby achieving a broader bandwidth with acceptable gain. As the resistance of the resonant circuit decreases, the Q decreases and the bandwidth increases. The device $M_{b5}$ and $M_{21}$ from a current mirror controlled by $I_{b1}$ that feeds current into the differential amplifier comprising $M_{21}$, $M_{22}$, $M_{23}$, $R_{11}$ and $R_{12}$ which amplifies the output of the $I_I$ signal mixed by $\Theta_I$ and $\overline{\Theta}_I$ to generate the $if_{Iout}$ outputs. The outputs of $if_{Iout}$ are extracted just above these two resistors $R_{11}$ and $R_{12}$.

Similarly, the right mixer comprises devices $M_{26}$-$M_{30}$ and $M_{b6}$ and resistors $R_{13}$ and $R_{14}$. The mixer switches $M_{26}$ and $M_{27}$ are enabled and disabled by two of the quadrature clock signals $\Theta_Q$ and $\overline{\Theta}_Q$. The current $I_Q$ charges/discharges the gate capacitance of $M_{29}$ and $M_{30}$ whenever the clock signals $\Theta_Q$ and $\overline{\Theta}_Q$ enables the gates $M_{26}$ and $M_{27}$. The device $M_{b6}$ and $M_{28}$ from a current mirror controlled by $I_{b2}$ that feeds current into the differential amplifier comprising $M_{28}$, $M_{29}$, $M_{30}$, $R_{13}$ and $R_{14}$ which amplifies the output of the $I_Q$ signal mixed by $\Theta_Q$ and $\overline{\Theta}_Q$ to generate the $if_{Qout}$ outputs. The outputs of $if_{Qout}$ are extracted just above these two resistors $R_{13}$ and $R_{14}$.

Figure 7B:
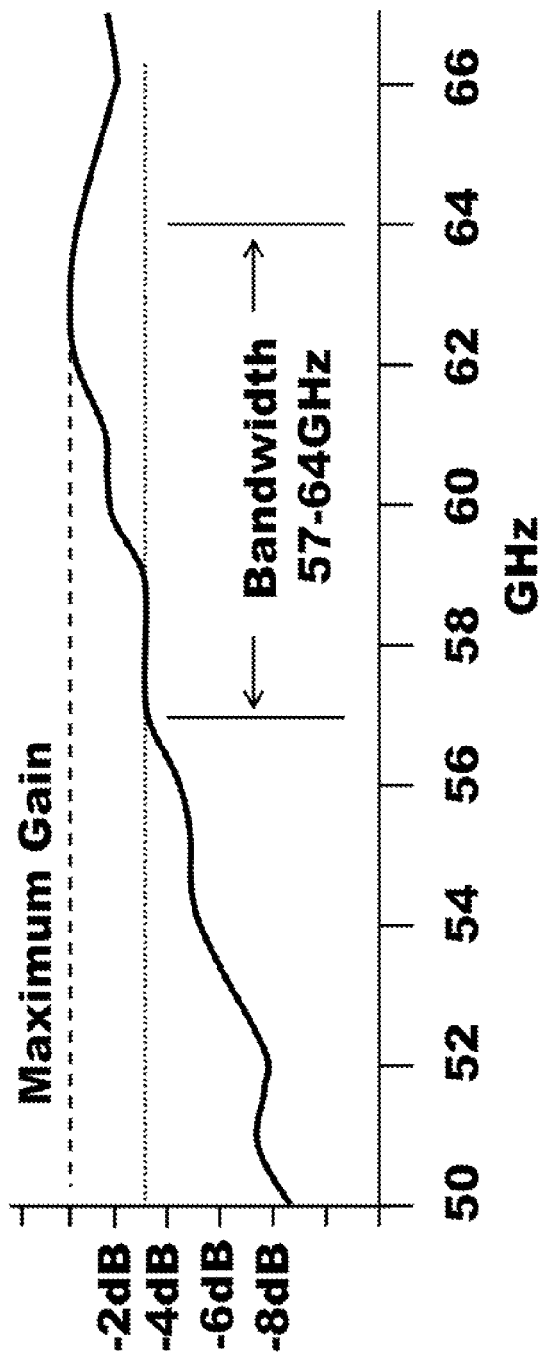
FIG. 7b depicts the measured gain response of the common source LNA, Quadrature oscillator outputs and I and Q mixers in accordance with the present invention.

FIG. 7b provides the measured result of the common source LNA and the switched capacitor driven mixer. The measured maximum gain of the front end of the WiGig receiver suffices the required specifications. Instead of using the constant parasitic capacitive load in the simulation models for the results provided in FIGS. 5a-d, the measured results provided in FIG. 7b corresponds to the dynamic parasitic capacitive load of the mixer being mixed with the local quadrature oscillators. In particular, note that within the range of allowed bandwidth (57-64 GHz), the gain of the front end remains within 3.2 dB of the maximum gain at 63 GHz.

FIG. 8a presents the top die view of the layout of the common source LNA, the inductors and the mixer. Referring to FIG. 4a, the source of the input signal (in$_s$) arrives at the top on metal 8 layer. The metal 8 layer is patterned into a spiral inductor $L_{14}$. At the end of inductor $L_{14}$ a via connects to a metal 7 layer. The metal 7 layer couples to a via stack and provides the signal to the gate of device $M_8$. The drain of device $M_8$ is couple through another via stack to the metal 8 layer forming $L_{13}$. The other end of $L_{13}$ is coupled to VSS. Note that there is mutual magnetic coupling between the inductors $L_{14}$ and $L_{13}$. The peaking inductor $L_{16}$ formed in the metal 8 layer couples and band pass filters the signal at the drain of $M_8$ to the source of $M_7$. The gate of $M_7$ is coupled to VDD (not shown) while the drain couples to the inductor $L_{15}$ formed in the metal 8 layer. The other end of $L_{15}$ is coupled to a via to the metal 7 layer and connects to VDD. The drain of $M_7$ is also coupled to one plate of the coupling capacitor $C_{coup}$ formed in the metal 8 layer. Beneath this metal 8 layer is a metal 7 layer forming the lower plate of the coupling capacitor $C_{coup}$ and the lower plate is coupled to the two mixers as shown in FIG. 7a. The view along the cut A-A' is presented in FIG. 8b. The top metal 8 layer forms one plate of the capacitor and is separated by oxide from the lower metal 7 layer forming the other plate of the capacitor $C_{coup}$.

FIG. 8c illustrates a cross-sectional view of a via stack within a die with eight metal layers. A via stack also known as a stacked via, stacked plug, or stacked contact is illustrated in FIG. 8c. The via between different metal layers are placed over the via of the lower layers to save on area. However, as one progresses from poly to metal 1 to metal 2 and up to metal 8, the vias, for example 8-1 and 8-3, increase in diameter. Each via, for instance, the via 8-1 and the metal 1 layer 8-2 introduce contact resistance and inductance. The via 8-3 and metal 5 layer 8-4 also introduce contact resistance and resistance into the path. The via stack can be tapped to introduce/extract a signal into/out of the stack or alter the parasitics in a circuit. The tapping occurs when a metal layer is extended from the stack and this location is called a tap point. Typically, the top metals in a technology are significantly thicker than any of the lower layer metals. The dielectric layers surround the vias and the metal segments $M_2$, $M_3$, etc. and each one of these dielectric layers is approximately 0.5 μm thick. The metal 1 through metal 7 layers are also about 0.5 μm thick while the metal 8 layer can be over 1 μm thick. The height of these via stacks is about 3 to 4 μm.

Finally, it is understood that the above description are only illustrative of the principle of the current invention. Various alterations, improvements, and modifications will occur and are intended to be suggested hereby, and are within the spirit and scope of the invention. This invention may, however, be embodied in many different forms and should not be construed as limited to the embodiments set forth herein. Rather, these embodiments are provided so that the disclosure will be thorough and complete, and will fully convey the scope of the invention to those skilled in the arts. It is understood that the various embodiments of the invention, although different, are not mutually exclusive. In accordance with these principles, those skilled in the art may devise numerous modifications without departing from the spirit and scope of the invention. Although the circuits were described using CMOS, the same circuit techniques can be applied to depletion mode devices and BJT or biploar circuits, since this technology allows the formation of current sources and source followers. When a device is specified, the device can be a transistor such as an N-MOS or P-MOS. The CMOS or SOI (Silicon on Insulator) technology provides two enhancement mode channel types: N-MOS (n-channel) and P-MOS (p-channel) devices or transistors. The via stacks can be fabricated using tungsten or copper. In addition, a network and a portable system can exchange information wirelessly by using communication techniques such as TDMA (Time Division Multiple Access), FDMA (Frequency Division Multiple Access), CDMA (Code Division Multiple Access), OFDM (Orthogonal Frequency Division Multiplexing), UWB (Ultra Wide Band), WiFi, WiGig, Bluetooth, etc. The network can comprise the phone network, IP (Internet protocol) network, LAN (Local Area Network), ad hoc networks, local routers and even other portable systems.

What is claimed is:

1. A receiver comprising:
a LNA (Low Noise Amplifier) configured in a cascode structure coupled to a resonant circuit;
the resonant circuit provides an output signal spectrum; and
a width of a top cascode device in the LNA is reduced with respect to a constant width of a lower cascode device to decrease a center frequency of the resonant circuit.

2. The receiver of claim 1, further comprising:
a first switched capacitor circuit capacitively coupled to the resonant circuit.

3. The receiver of claim 2, wherein
an oscillator clocks the first switched capacitor circuit presenting an impedance to the resonant circuit; and
the impedance of the first switched capacitor circuit increases a bandwidth of the resonant circuit.

4. The receiver of claim 1, further comprising:
an input signal spectrum coupled to an input of the LNA.

5. The receiver of claim 2, further comprising:
the resonant circuit capacitively coupled to a second switched capacitor circuit;
a clock signal of an oscillator enables a first mixer switch of the first switched capacitor circuit coupled to a first input of a first differential amplifier;
an inverse clock signal of the oscillator enables a second mixer switch of the second switched capacitor circuit coupled to a second input of the first differential amplifier; and
outputs of the first differential amplifier provide an in-phase sum frequency and an in-phase difference frequency spectrum between an output signal spectrum of the resonant circuit and the clock signal.

6. The receiver of claim 5, wherein
the first and second switched capacitor circuits comprise a first mixer.

7. The receiver of claim 6, wherein
energy from the resonant circuit powers the first mixer.

8. The receiver of claim 5, further comprising:
the resonant circuit capacitively coupled to a third switched capacitor circuit;
the resonant circuit capacitively coupled to a fourth switched capacitor circuit;
a quadrature clock signal of the oscillator enables a third mixer switch of the third switched capacitor circuit coupled to a first input of a second differential amplifier;
a quadrature inverse clock signal of the oscillator enables a fourth mixer switch of the fourth switched capacitor circuit coupled to a second input of the second differential amplifier; and
outputs of the second differential amplifier provide a quadrature sum frequency and a quadrature difference frequency spectrum between the output signal spectrum and the quadrature clock signal.

9. A receiver comprising:
a LNA (Low Noise Amplifier) coupled to a resonant circuit providing an output signal spectrum;
the resonant circuit capacitively coupled to a first switched capacitor circuit;
an oscillator clocks the first switched capacitor circuit coupling an impedance across the resonant circuit; and
the impedance of the first switched capacitor circuit increases a bandwidth of the resonant circuit.

10. The receiver of claim 9, wherein
the LNA is configured in a cascode structure.

11. The receiver of claim 10, wherein
a width of a top cascode device in the LNA is adjusted with respect to a width of a lower cascode device to shift a center frequency of the resonant circuit.

12. The receiver of claim 9, further comprising:
an input signal spectrum coupled to an input of the LNA.

13. The receiver of claim 9, further comprising:
the output signal spectrum capacitively coupled to a second switched capacitor circuit;
a clock signal of the oscillator enables a first mixer switch of the first switched capacitor circuit coupled to a first input of a first differential amplifier;
an inverse clock signal of the oscillator enables a second mixer switch of the second switched capacitor circuit coupled to a second input of the first differential amplifier; and
outputs of the first differential amplifier provide an in-phase sum frequency and an in-phase difference frequency spectrum between the output signal spectrum and the clock signal.

14. The receiver of claim 13, wherein
the first and second switched capacitor circuits comprise a first mixer.

15. The receiver of claim 14, wherein
energy from the resonant circuit powers the first mixer.

16. The receiver of claim 13, further comprising:
the resonant circuit capacitively coupled to a third switched capacitor circuit;
the resonant circuit capacitively coupled to a fourth switched capacitor circuit;
a quadrature clock signal of the oscillator enables a third mixer switch of the third switched capacitor circuit coupled to a first input of a second differential amplifier;
a quadrature inverse clock signal of the oscillator enables a fourth mixer switch of the fourth switched capacitor circuit coupled to a second input of the second differential amplifier; and
outputs of the second differential amplifier provide a quadrature sum frequency and a quadrature difference frequency spectrum between the output signal spectrum and the quadrature clock signal.

* * * * *